US 8,899,415 B2

(12) United States Patent
McCosh et al.

(10) Patent No.: US 8,899,415 B2
(45) Date of Patent: Dec. 2, 2014

(54) ELECTRONIC DEVICE CASE HAVING VARIABLE ANGLE STAND

(75) Inventors: Benjamin McCosh, Cotati, CA (US); Luis Quehl, Santa Rosa, CA (US); Peter Hill, Sebastopol, CA (US)

(73) Assignee: DayMen Canada Acquisition ULC, Vancouver (CA)

( * ) Notice: Subject to any disclaimer, the term of this patent is extended or adjusted under 35 U.S.C. 154(b) by 0 days.

(21) Appl. No.: 13/442,054

(22) Filed: Apr. 9, 2012

(65) Prior Publication Data

US 2013/0264241 A1 Oct. 10, 2013

(51) Int. Cl.
*B65D 85/00* (2006.01)
*H05K 5/03* (2006.01)

(52) U.S. Cl.
CPC ........................................ *H05K 5/03* (2013.01)
USPC ........... 206/320; 206/472; 206/474; 206/752; 248/188.6

(58) Field of Classification Search
CPC ....................................................... H05K 5/03
USPC ............... 206/320, 472, 474, 752; 248/188.2, 248/188.6
See application file for complete search history.

(56) References Cited

U.S. PATENT DOCUMENTS

| | | | |
|---|---|---|---|
| 237,890 A * | 2/1881 | Menahan ....................... | 150/118 |
| 396,508 A | 1/1889 | Pearson | |
| 876,062 A | 1/1908 | Keiser | |
| 1,613,536 A * | 1/1927 | Rose ............................. | 132/315 |
| 2,784,757 A * | 3/1957 | Bosca Orsino et al. ........ | 150/138 |
| 3,981,522 A * | 9/1976 | Bloom ............................ | 281/34 |
| 5,518,486 A * | 5/1996 | Sheeler ......................... | 482/131 |
| 6,648,139 B2 | 11/2003 | Fisher, Jr. et al. | |
| 6,662,753 B1 * | 12/2003 | Sporn ........................... | 119/797 |
| 6,772,879 B1 * | 8/2004 | Domotor ..................... | 206/45.23 |
| 6,892,880 B2 | 5/2005 | Nieves | |
| 7,416,356 B2 * | 8/2008 | Quilantan ..................... | 401/131 |
| 7,540,378 B2 | 6/2009 | Gallagher | |
| 7,673,745 B2 * | 3/2010 | Sirichai et al. ............. | 206/45.23 |
| 7,735,644 B2 | 6/2010 | Sirichai et al. | |
| 8,235,208 B2 * | 8/2012 | Sirichai et al. ................ | 206/320 |
| 2003/0214779 A1 | 11/2003 | Socolofsky | |
| 2004/0173482 A1 | 9/2004 | Nieves | |
| 2007/0114783 A1 | 5/2007 | Glosh et al. | |
| 2007/0278128 A1 | 12/2007 | Slaton | |

(Continued)

OTHER PUBLICATIONS

"Sony eBook Reader Touch (PRS-600) Cover—Black", http://www.whsmith.co.uk/CatalogAndSearch/ProductDetails-Sony+eBook+Reader+Touch+Cover++Black-34170977.html, (Publication Date Unknown).

(Continued)

*Primary Examiner* — Anthony Stashick
*Assistant Examiner* — James M Van Buskirk
(74) *Attorney, Agent, or Firm* — Medler Ferro PLLC

(57) ABSTRACT

An electronic device holder includes a front panel, a back panel, and a spine connecting the front panel and the back panel. A strap includes a first end coupled to an exterior surface of the front panel. The strap extends from the first end across the spine and through a friction buckle coupled to the back panel. The strap may be pulled through the friction buckle such that a distance between the first end of the strap and the friction buckle is variable. The friction buckle can hold the strap at any location along the strap such that any distance between the first end of the strap and the friction buckle may be maintained.

13 Claims, 8 Drawing Sheets

(56) References Cited

U.S. PATENT DOCUMENTS

| | | | |
|---|---|---|---|
| 2008/0083631 A1 | 4/2008 | Tsang et al. | |
| 2008/0196804 A1 | 8/2008 | Hsu | |
| 2009/0045091 A1 | 2/2009 | O'Neill et al. | |
| 2010/0294683 A1* | 11/2010 | Mish et al. ............... | 206/320 |
| 2011/0204758 A1 | 8/2011 | Loncar et al. | |

OTHER PUBLICATIONS

"M-Edge Executive JacketTM for the Amazon Kindle", http://www.buymedge.com/images/brochures/ME 2008 Kindle Brochure.pdf, (Winter 2008).

"Amazon Kindle Leather Cover (Fits 6" Display, Latest Generation Kindle)", http://www.amazon.com/Amazon-Kindle-Leather-Cover-Generation/dp/B001JAH7OM/ref=pd sim e 16, (Publication Date unknown).

"Sony E-Reader Silicone Cover", http://www.play.com/Electronics/Electronics/4-/6847048/Sony-E-Reader-Silicone-Cover/Product.html#, (Publication Date Unknown).

"Morph your iPad with the modulR case system", *Gadgeteer*, (Mar. 11 2010).

Hutchinson, Roland "ModulR iPad Case", http://www.geeky-gadgets.com/modulr-ipad-case-11-03-2010/, (Mar. 11, 2010).

Roberto "modulR Unveils Product Lineup and Pricing", http://www.padgadget.com/2010/06/02/modulr-unveils-product-lineup-and-pricing/, (Jun. 2, 2010).

"modulR unveils product lineup and pricing", *modulR press release*, (Jun. 2, 2010).

"Say hello to modulR, a new case and line of accessories for the Apple iPad", *modulR press release*, (Mar. 10, 2010).

"Quirky Cloak", http://www.quirky.com/products/30-Cloak, (Preliminary Engineering completed Mar. 30 2010).

* cited by examiner

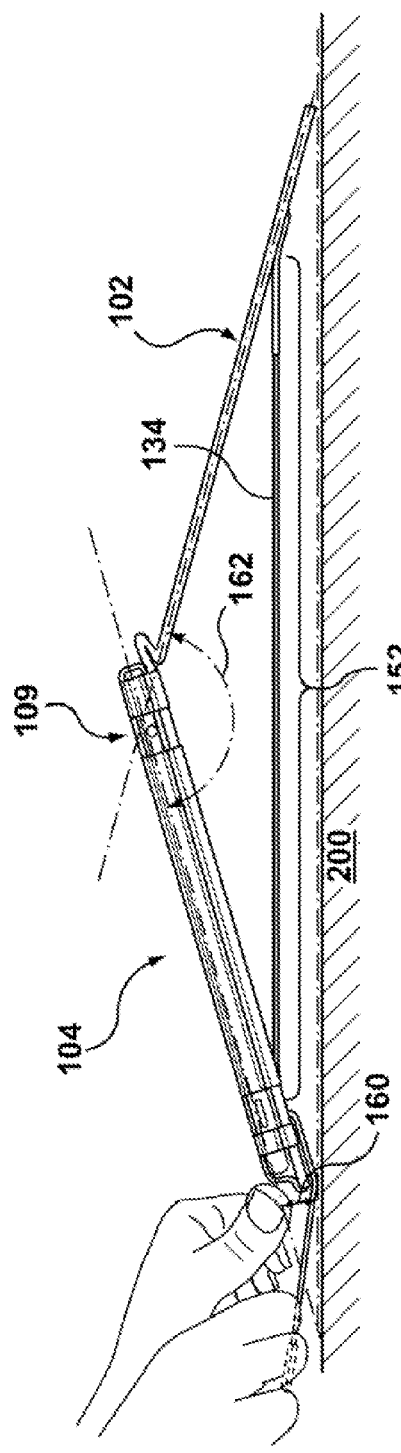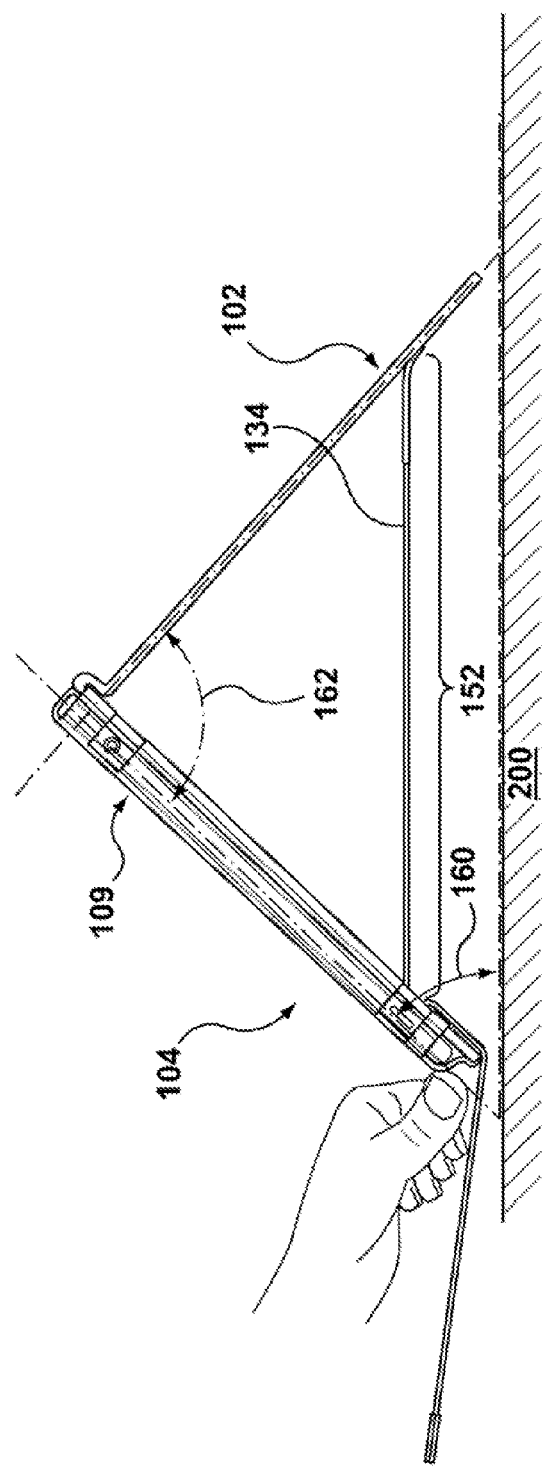

ELECTRONIC DEVICE CASE HAVING VARIABLE ANGLE STAND

FIELD OF THE INVENTION

The invention is related to a holder or case for an electronic device such as a tablet computer.

BACKGROUND OF THE INVENTION

Portable or handheld electronic devices, such as eReader devices, personal digital assistants, cellular telephones, tablet computers and the like, have internal circuitry, delicate components, and screens that are prone to damage. Thus, there are holders, covers or cases for such devices that protect such devices from the environment. There is often a desire to stand these electronic devices at an incline or angle towards the user when watching video programming, viewing still images, or typing on a touch-screen keypad/keyboard that appears on the device screen. In order to protect their device and serve all viewing preferences, users often purchase protective holders or cases with viewing stands.

There are a variety of conventional hard-shell and soft-shell cases available for mobile phones, PDAs and portable video/music players, and table computers, but these have rather limited functionality. Although they generally succeed in protecting the portable electronic device, they can detract from its portability, usability and/or aesthetic appearance, and fall short of the needs of the user in many other ways. Moreover, the stand mechanisms currently in use generally are awkward, bulky, or ineffective. Further, the stand mechanisms generally limit the angle at which the device is displayed to one or a few angles.

BRIEF SUMMARY OF THE INVENTION

Embodiments hereof relate to a case or holder for portable devices. In particular, embodiments hereof relate to a case for an electronic device, wherein the case includes a first or book configuration and a second or stand configuration. In the stand configuration, the angle of the panel holding the electronic device is variable between parallel with a support surface on which the case is placed to approximately 85 degrees with respect to the surface on which the case is placed. In particular, the angle is variable such that any angle between parallel and 85 degrees may be utilized.

Embodiments hereof relate to an electronic device holder having a front panel, a back panel, and a spine connecting the front panel and the back panel. A strap includes a first end coupled to an exterior surface of the front panel. The strap extends from the first end across the spine and through a friction buckle coupled to the back panel. The strap may be pulled through the friction buckle such that a distance between the first end of the strap and the friction buckle is variable. The friction buckle can hold the strap at any location along the strap such that any distance between the first end of the strap and the friction buckle may be maintained. With the exterior surfaces of the front and back panels disposed against a support surface, the strap can be pulled to reduce the distance from the first end of the strap to the friction buckle, thereby raising the exterior surfaces of the front and back panels from the support surface such that the outer edges of the front and back panels rest against the support surface to support the holder while the strap and friction buckle prevent the front and back panels from splaying apart under the weight of an electronic device disposed within the holder and forces by a user using a touch screen of the electronic device.

BRIEF DESCRIPTION OF DRAWINGS

The foregoing and other features and advantages of the invention will be apparent from the following description of the invention as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIGS. 9-10 are views showing the adjustability of the viewing angle of the holder of FIG. 1.

DETAILED DESCRIPTION OF THE INVENTION

Figure 1:
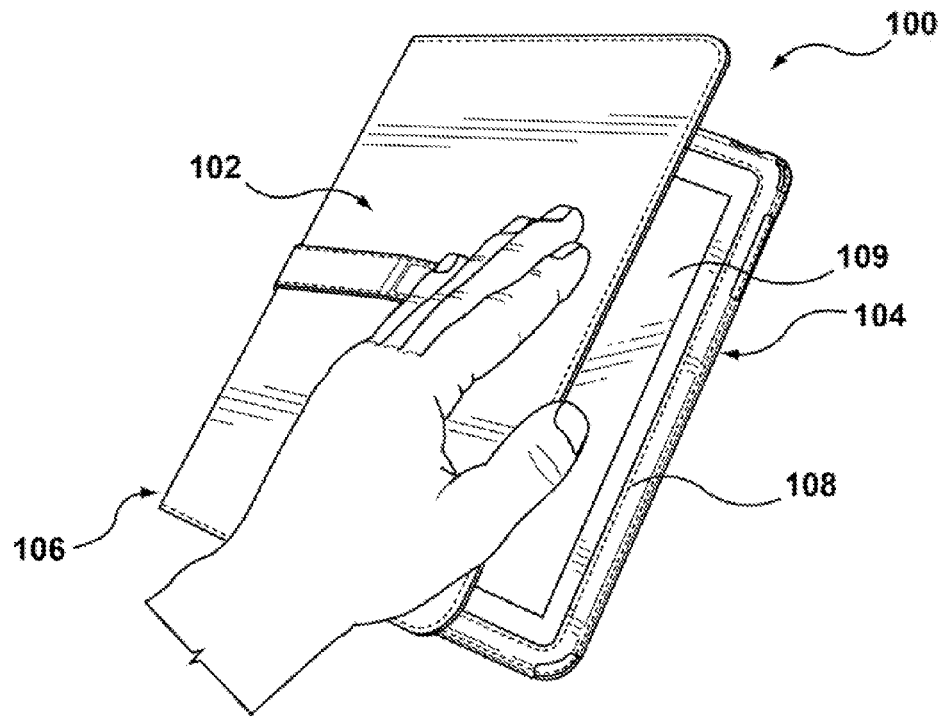
FIG. 1 is an illustration of an electronic device case according to an embodiment hereof

Specific embodiments of the present invention are now described with reference to the figures, wherein like reference numbers indicate identical or functionally similar elements. The following detailed description is merely exemplary in nature and is not intended to limit the invention or the application and uses of the invention. Although the description of the invention is in the context of securing electronic devices, the invention may also be used to secure other devices as it is deemed useful. Furthermore, there is no intention to be bound by any expressed or implied theory presented in the preceding technical field, background, brief summary or the following detailed description.

Embodiments hereof relate to an electronic device holder 100 for protecting, viewing and operating an electronic device 109. Holder 100 may be formed from a relatively hard or rigid material that operates to protect the electronic device from breakage or damage. In the embodiment depicted in FIGS. 1-16, holder 100 includes a first or front panel 102 connected to a second or back panel 104 via a spine 106 in the manner of a book. Back panel 104 includes a border 108 that extends from edges of back panel 104 and is spaced from an interior surface 116 of back panel 104 such that border 108 creates as space for electronic device 109 and holds electronic device 109 in holder 100. In the embodiment shown, border 108 is generally continuous around three sides of back panel 104, with openings 110 strategically located through border 108 for access to edges of electronic device 109. For example, and not by way of limitation, openings 110 may provide access to power ports, USB ports, power switches, headphone ports, volume controls, and other similar items generally found along edges of electronic devices. Back panel 104 may also include openings 113 for such items as camera lenses, speakers, microphones, etc. Border 108 further includes an opening 111 running adjacent and parallel to spine 106 for a user to be able to insert and remove electronic device 109 from border 108. Further, rather than border 108 being generally continuous with openings 110, border 108 may be more sporadically located to the point of being located only at the corners of back panel 104 to hold electronic device 109. Border 108 and holder 100 are generally sized to hold particular sizes of electronic devices. For example, and not by way of limitation, holder 100 and corresponding border 108 may be sized to receive an eBook reader such as the Kindle™, or tablet computers, such as the iPad™ from Apple Inc. or other similar devices. Holder 100 and border 108 may also be sized to hold other electronic devices such as a mobile phone, a personal digital assistant (PDA), an MP3 player, or other handheld portable electronic device.

Figure 2:
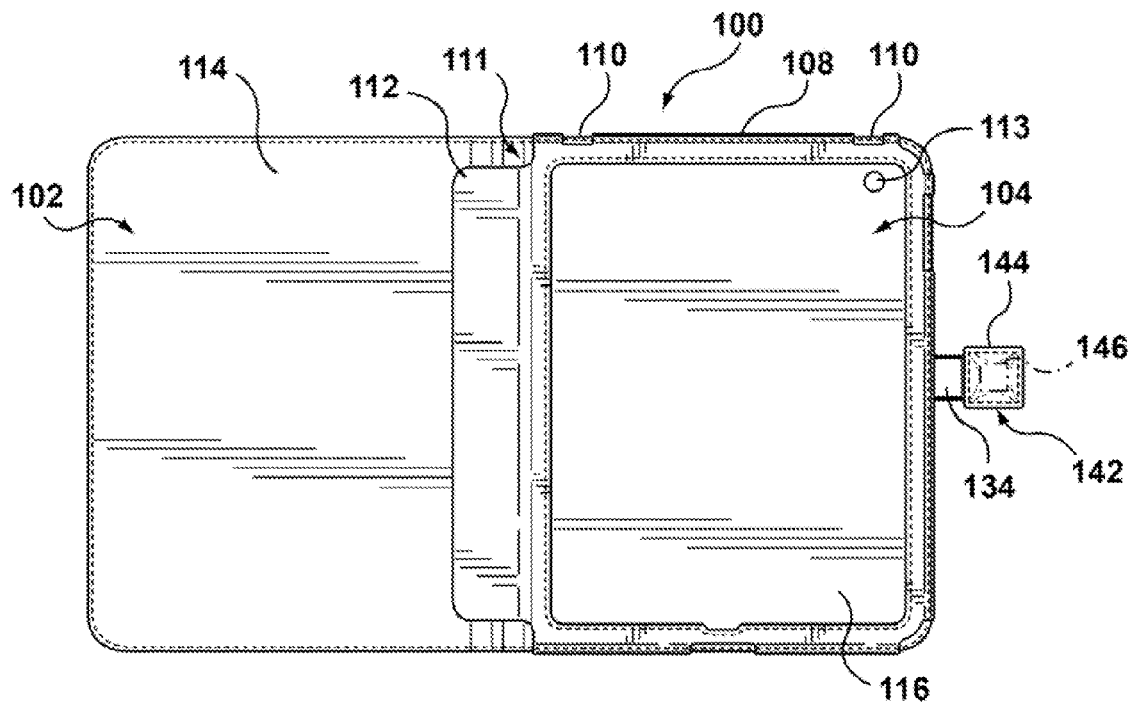
FIG. 2 is a laid open view of the electronic device holder of FIG. 1 with the inside surfaces of the case are visible.
Figure 3:
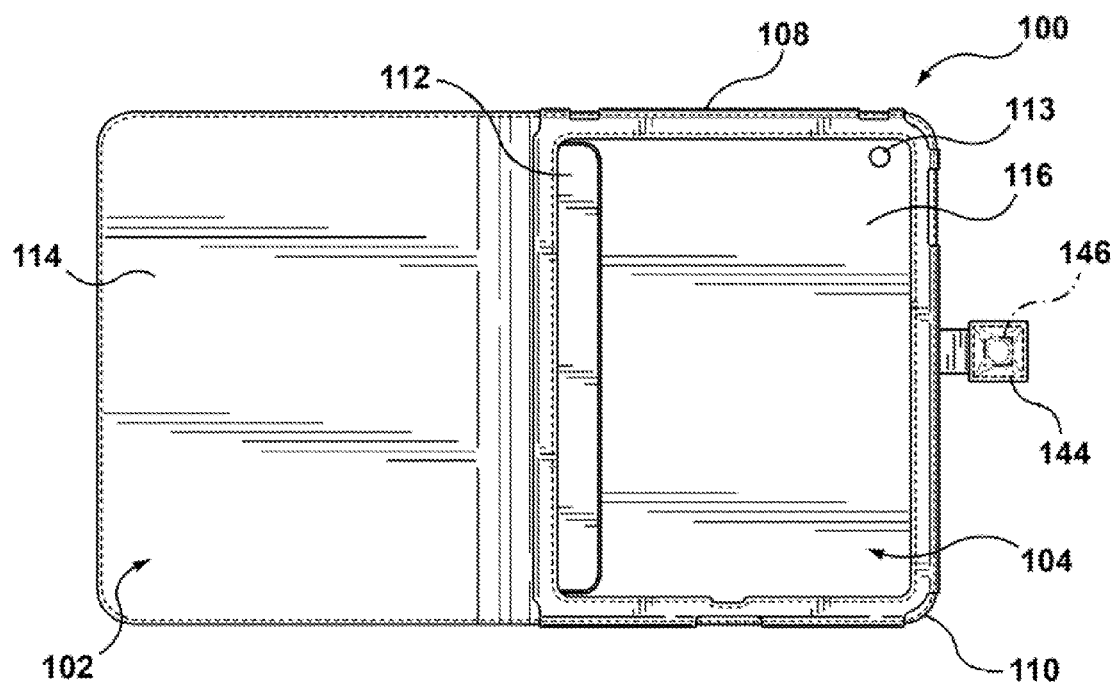
FIG. 3 is a laid open view similar to FIG. 2 with a flap of the border to hold the electronic device tucked within the border.

Border 108 may further include a flap 112 along opening 111 to further secure electronic device 109 within border 108. As seen in FIG. 2, flap 112 may be extended towards front panel 102 to provide access to opening 111 such that electronic device 109 may be inserted into border 108. After electronic device 109 has been inserted into border 108, flap 112 may be extended over the left edge of electronic device 109 and tucked behind electronic device 109, as shown in FIG. 3. FIG. 3 shows flap 112 in the position it would be with electronic device 109 secured within border 108, but does not show electronic device 109 for clarity.

Front panel 102, back panel 104, and spine 106 may be formed from any relatively hard or stiff protective material including but not limited to cardboard, bamboo, fiberboard, wood, wood fiber, metal, polymer, synthetic textiles, nylon, polyurethane, wool, polyester, and other suitable materials as would be known to those skilled in the art. In one embodiment, outer or exterior surfaces 118, 120 of front and back panels 102, 104, respectively, may include a covering for aesthetic purposes. The covering may be canvas, cloth, synthetic leather, leather, or tarpaulin. Further, in one embodiment, inner or interior surfaces 114, 116 of front and back panels 102, 104, respectively, may include an inner lining of a soft, non-scratch microfiber material and/or a thin padding of approximately 2-3 mm thickness between the lining and the hard protective material of front panel 104 to protect the electronic device when electronic device holder 100 is closed.

Figure 4:
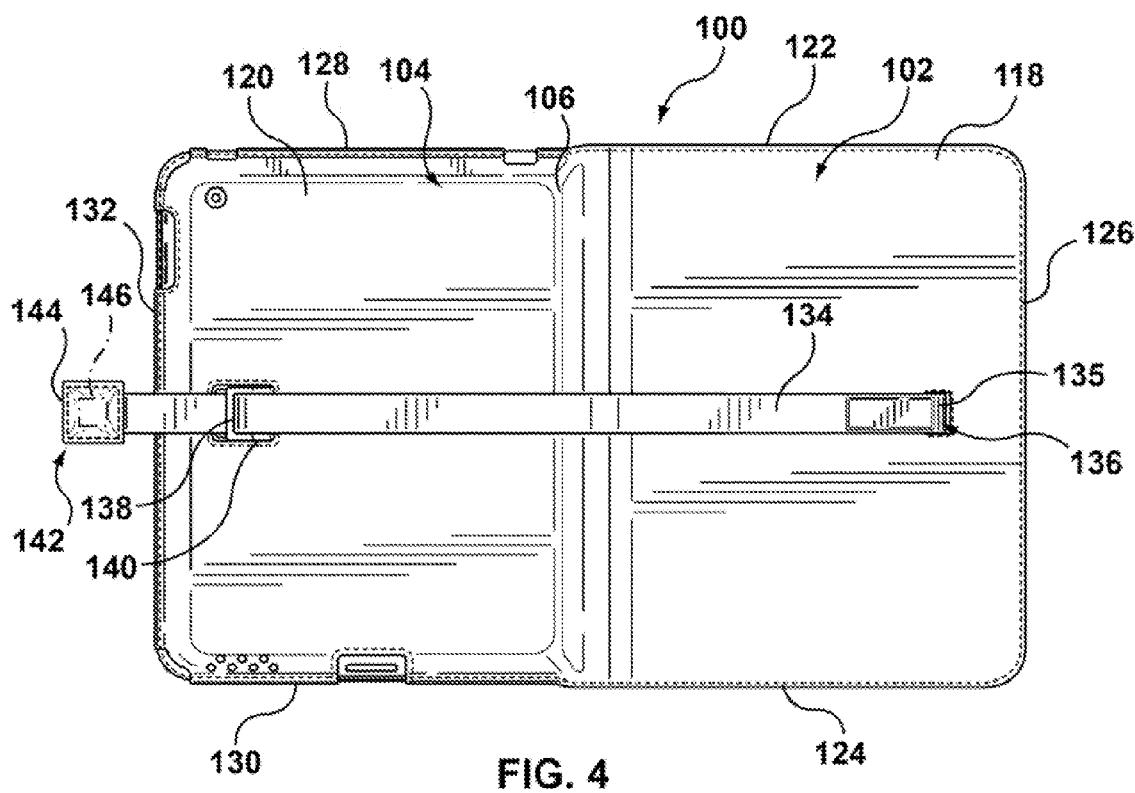
FIG. 4 is a back view of the holder of FIG. 1.
Figure 5:
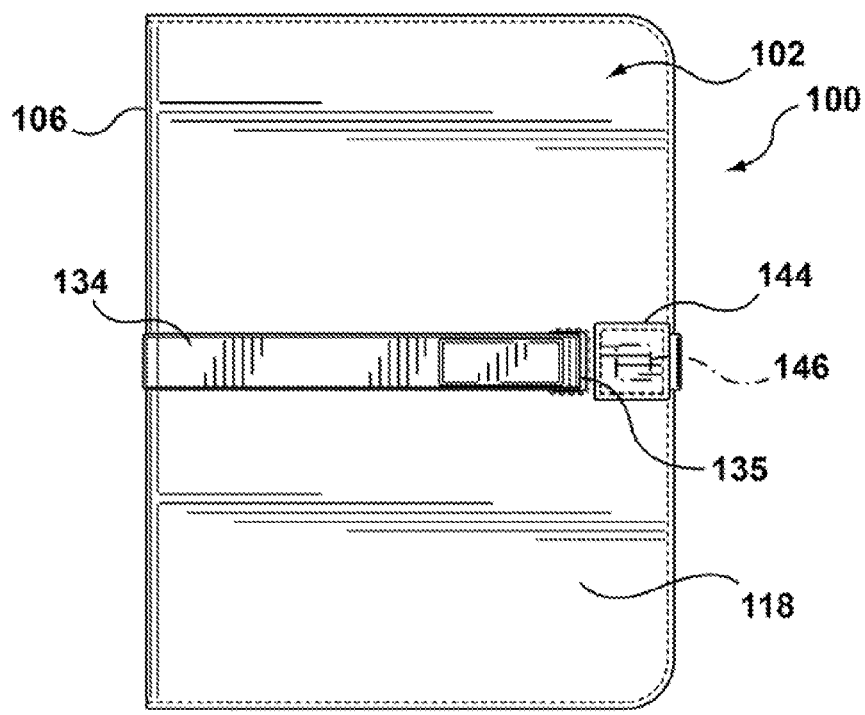
FIG. 5 is a view of the outside of the front panel of the holder of FIG. 1 in a closed configuration.
Figure 6:
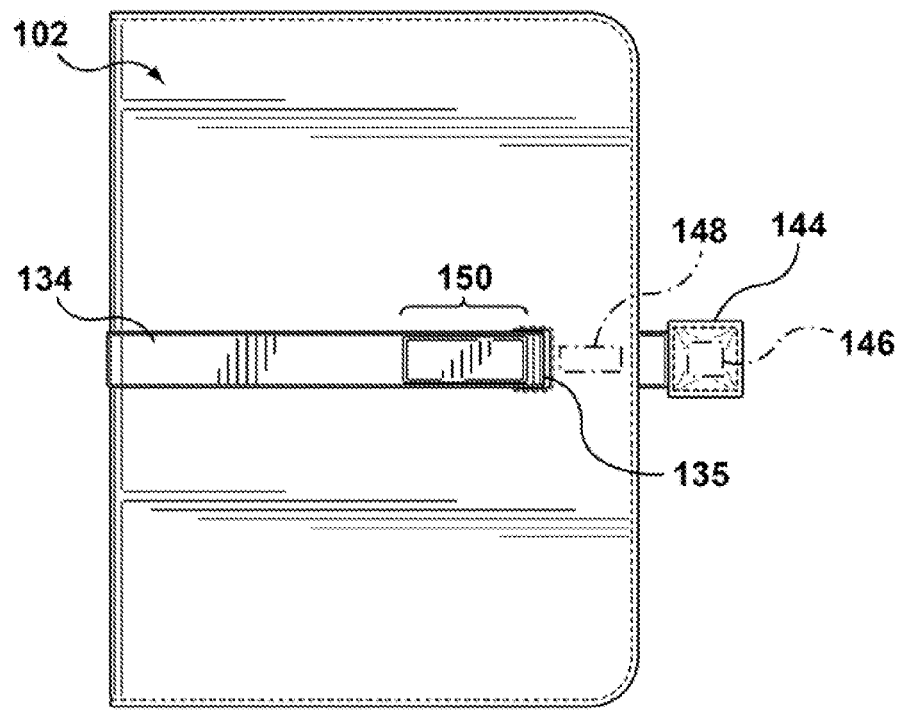
FIG. 6 is a view of the outside of front panel of the holder of FIG. 1 in the closed position with the closure device unattached.

FIGS. 4-6 show exterior surface of electronic device holder 100 and its closure and stand mechanism. In particular, as shown in FIG. 4, a strap 134 includes a first end 135 attached to exterior surface 118 of front panel 102 at attachment location 136. Strap 134 extends from attachment point 136 towards spine 106, across spine 106 and along exterior surface 120 of back panel 104. Strap 134 extends substantially parallel to top and bottom edges 122, 124 of front panel and top and bottom edges 128, 130 of back panel 104. Accordingly, strap 134 runs substantially perpendicular to outer edge 126 of front panel 102, outer edge 132 of back panel 104, and spine 106. The terms substantially parallel and substantially perpendicular as used herein mean about or approximately parallel and perpendicular such that strap 134 could vary up to 10 degrees from parallel or perpendicular and still be considered substantially parallel or substantially perpendicular. Strap 134 extends through a friction buckle 138 disposed in a recess 140 in exterior surface 120 of back panel 104, as shown in FIG. 4. Friction buckle 138 may be any type of buckle that allows strap 134 to pass therethrough and allows strap 134 to be pulled therethrough with the amount of force that can be comfortably asserted by a user of an electronic device. Further, friction buckle 138 should be able to hold strap 134 in place against a small force, such as the force exerted on strap 134 when the electronic device 109 is disposed within holder 100 and holder 100 is in the viewing and operating positions discussed in more detail below. Friction buckle 138 may be, for example and not by way of limitation, a three bar friction buckle, which is also referred to as a tri-glide buckle. Friction buckles and their equivalents are known to those of ordinary skill in the art. Because strap 134 extends through friction buckle 138, a second end 142 of strap 134 is disposed on an opposite side of friction buckle 138 than first end 135 of strap 134. Second end 142 of strap 134 may include a tab 144 with a magnet 146 (shown in phantom) disposed within tab 144, as shown in FIGS. 4-6. As shown in FIGS. 5 and 6, when holder 100 is in the closed or book configuration such that interior surfaces 114, 116 of front and back panels 102, 104 face each other and are substantially parallel to each other, and outer edges 126, 132 of front and back panels 102, 104 are generally aligned with each other, second end 142 of strap 134 and a portion of strap 134 extend from exterior surface 120 of back panel 104, across outer edges 126, 132, and back toward first end 135 of strap 124 along exterior surface 118 of front panel 102. As shown in FIG. 6, a magnet 148 (shown in phantom) may be disposed within front panel 102 such that magnet 146 in tab 144 may align with magnet 148 and the magnetic attraction will close holder 100, as shown in FIG. 5. Although a magnetic connection is shown and described, those skilled in the art would recognize that a snap connection, hook and loop connection, or other type of connection, or no connection at all, may be utilized.

Figure 7:
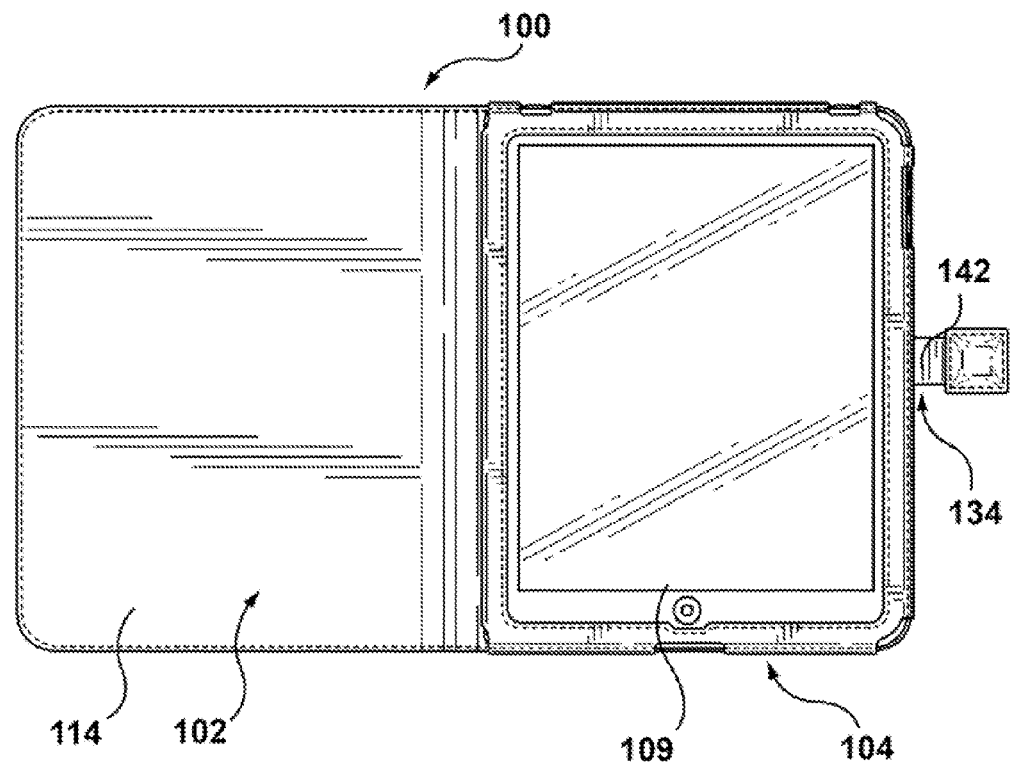
FIG. 7 is a view of the inside of the holder of FIG. 1 in a laid open position and with an electronic device disposed within the border of the back panel.
Figure 8:
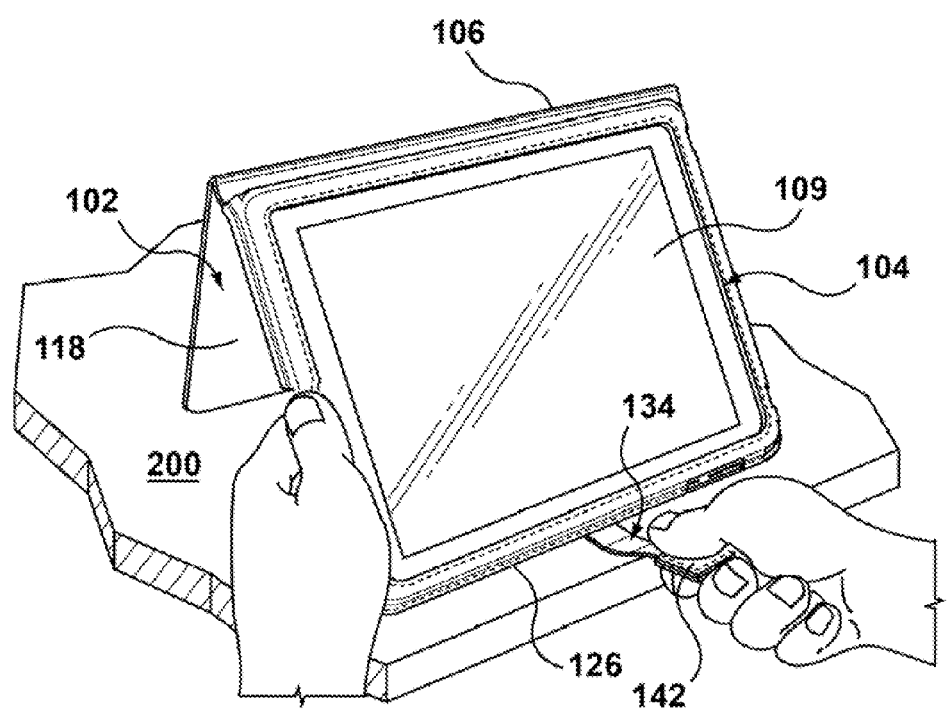
FIG. 8 is a perspective view of the holder of FIG. 1 in a landscape positions as the strap is pulled to adjust the viewing angle of the electronic device disposed within the holder.

FIGS. 7-13 show holder 100 with electronic device 109 disposed therein as holder 100 can be used to adjust the viewing angle of electronic device 109 in landscape mode. Although the particular embodiment of holder 100 shown is rectangular such that the terms landscape and portrait mode are used, those skilled in the art would recognize that holder may be square or that spine 106 may be disposed along a short edge of a rectangle rather that a long edge such that landscape and portrait modes are reversed as it relates the description herein. FIG. 7 shows holder 100 with electronic device 109 disposed therein laying flat against a support surface knot shown in FIG. 7, see FIGS. 8-10 and 12-13), with exterior surfaces 118, 120 of front and back panels 102, 104 resting against the support surface and interior surfaces 114, 116 facing away from the support surface. The support surface may be any surface upon which an electronic device may be used, such as, but limited to, a table, a desk, and a user's lap. As second end 142 of strap 134 is pulled, the length 152 of strap 134 between first end 135 and friction buckle 138 is reduced, causing exterior surfaces 118, 120 of front and back panels, 102, 104 to move towards each other as spine 106 bends outwardly, as shown in FIGS. 8-11. In particular, FIGS. 9 and 10 show the movement of front panel 102 and back panel 104 relative to each other and to support surface 200.

Figure 11:
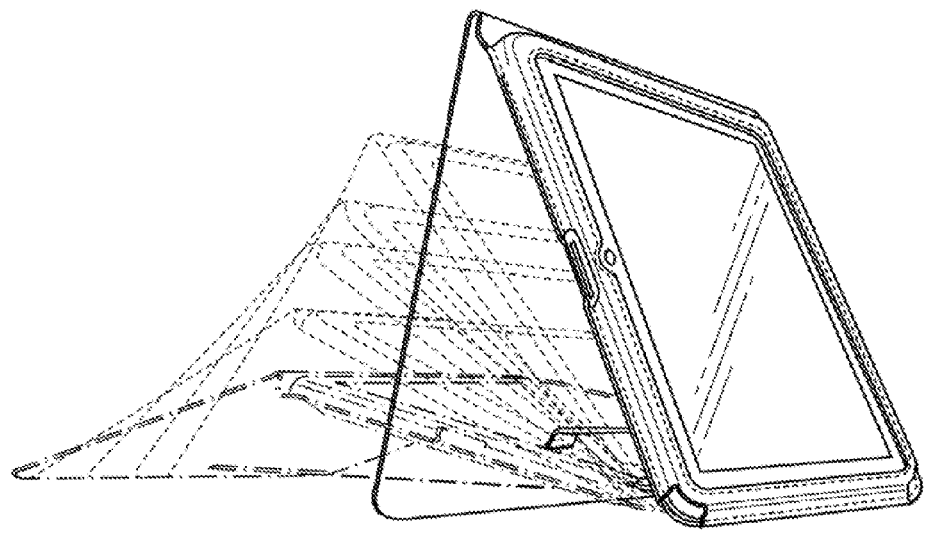
FIG. 11 is an illustration of the adjustability of viewing angle of the holder of FIG. 1.
Figure 12:
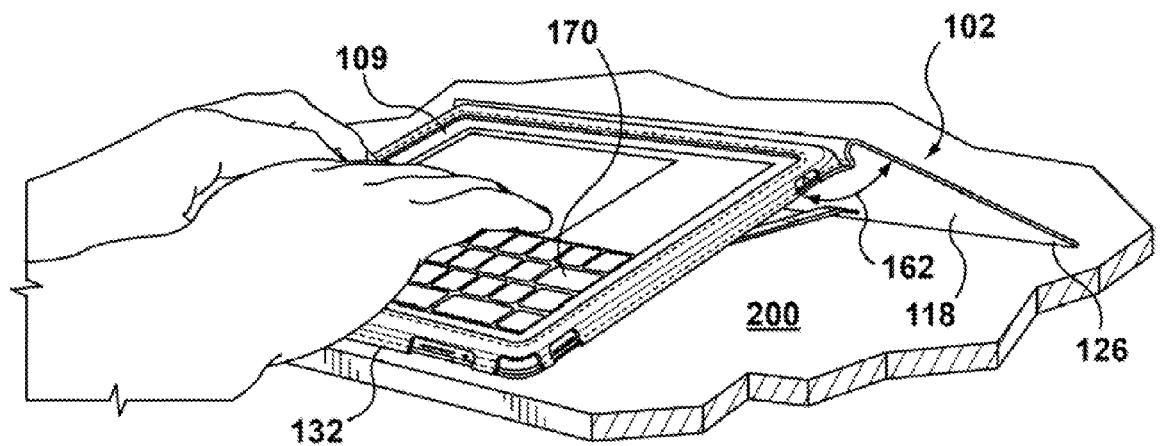
FIG. 12 is an illustration showing a configuration for typing on a touch-screen keypad of an electronic device disposed within the holder of FIG. 1.

FIG. 9 shows holder 100 after strap 134 has been pulled slightly such that exterior surfaces 118, 120 of front and back panels 102, 104 are not resting against support surface 200, but exterior surfaces 118, 120 are not far from parallel with support surface 200. Outer edges 126, 132 of front and back panels 102, 104 are resting against support surface 200, with spine 106 raised away from surface 200. In particular, an angle 160 between back panel 104 and support surface 200 is about zero when exterior surfaces 118, 120 are laying against support surface 200 (FIG. 7), and is relatively small when strap has been pulled a small amount, as shown in FIG. 9. An angle (not shown) between front panel 102 and support surface 200 is approximately the same as angle 160. Similarly, an angle 162 between front panel 102 and back panel 104 is approximately 180 degrees when exterior surfaces 118, 120 are laying flat against support surface 200 (FIG. 7), and is decreased as strap 134 is pulled slightly, as shown in FIG. 9. As strap 134 continues to be pulled, angle 160 increases and angle 162 decreases, as illustrated in FIGS. 9 and 10. Due to friction buckle 138, strap 134 may be pulled such that the length 152 of strap 134 between first end 135 and friction buckle 138 is infinitely variable between a length 152 such that angle 162 is approximately 180 degrees and a length 152 of strap 134 such that angle 160 is approximately 90 degrees and angle 162 is approximately zero degrees. FIG. 11 is an illustration showing the movement of holder 100 from a relatively large angle 162 to a relatively small angle 162. As noted above, strap 134 and friction buckle 138 enables a user to set angle 162 at virtually any angle for comfortable viewing or use of electronic device 102 disposed within back panel 104 of holder 100. FIG. 12 shows holder 100 with edges 126, 132 resting on support surface 200 at a convenient angle for typing on a touch screen keyboard 170 that appears on electronic device 109, with angle 162 being relatively large and angle 160 being relatively small.

Figure 13:
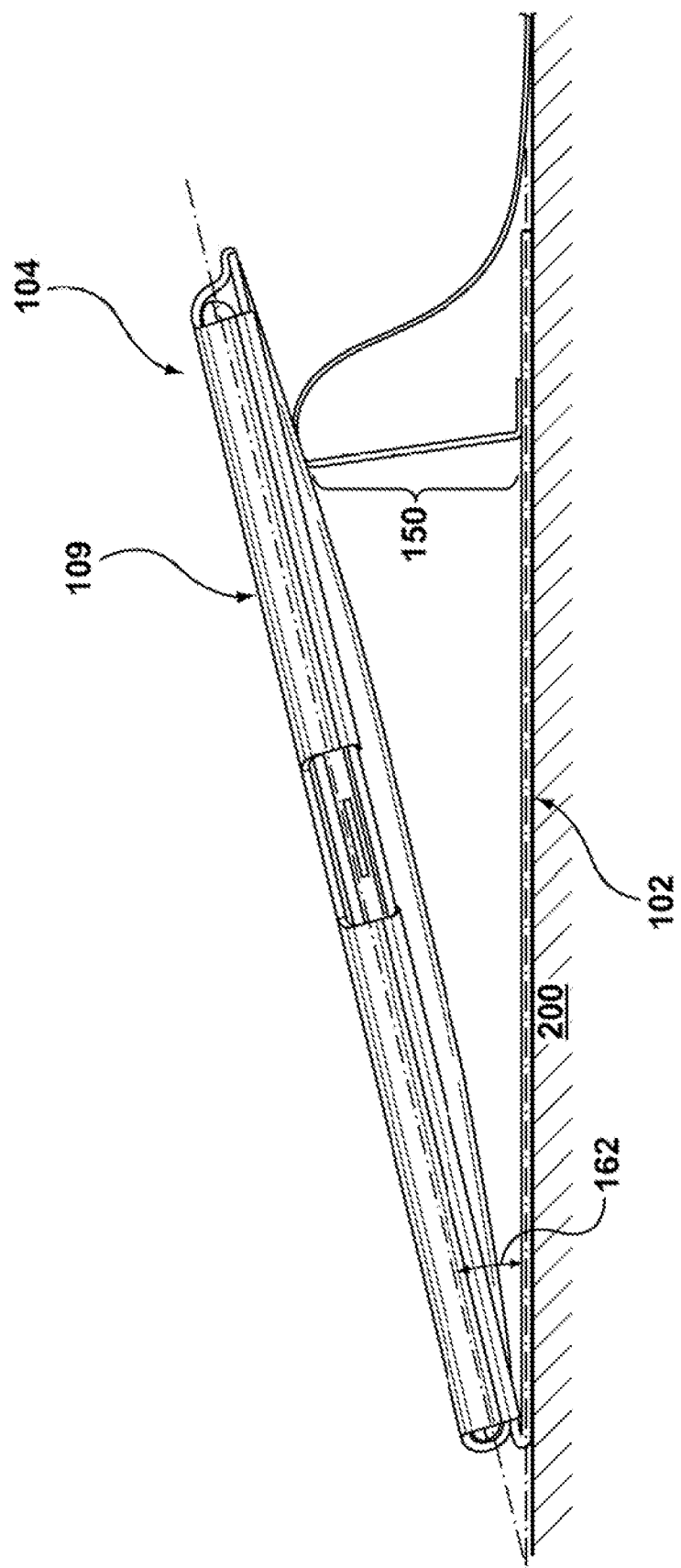
FIG. 13 is a an illustration of the strap of the holder of FIG. 1 pulled through until the stiffened portion of the strap reaches the friction buckle and with an interior surface of the front panel resting on a surface such that the electronic device can be viewed in a landscape position and the user can utilize the touch-screen and a touch-screen keypad.

In the particular embodiment shown, the length 152 is limited on the lower end by the length of a stiffened region 150 of strap 134. Stiffened region 150 of strap 134 does not slide/fit through friction buckle 138. Thus, the length 152 between first end 135 and friction buckle 138 must be at least the length of stiffened region 150. Depending on the length of stiffened region 150, the angle 160 is limited to less than 90 degrees and the angle 162 is more than zero degrees. For example, and not by way of limitation, a stiffened region 150 of approximately 1.5 inches would limit angle 160 to less than approximately 85 degrees and angle 162 to more than approximately 5 degrees. It would be understood by those skilled in the art that the length of stiffened region 152 of strap 134 may be longer or shorter, and that stiffened region is may be excluded in its entirety. Stiffened region 150 also serves the purpose that when strap 134 is pulled through friction buckle 138 such that only stiffened region 150 of strap 134 is disposed between first end 135 and friction buckle 138, and inner surface 114 of front panel 102 holder is laid against surface 200, stiffened region 150 can support back panel 104 with electronic device 109 disposed therein, as shown in FIG. 13. In this configuration with inner surface 114 of front panel 102 resting on support surface 200, angle 162 between front panel 102 and back panel 104 is approximately equal to an angle between back panel 104 and surface 200, as shown in FIG. 13. This is another convenient configuration for typing on a touch screen keyboard 170 that appears on electronic device 109.

Figure 14:
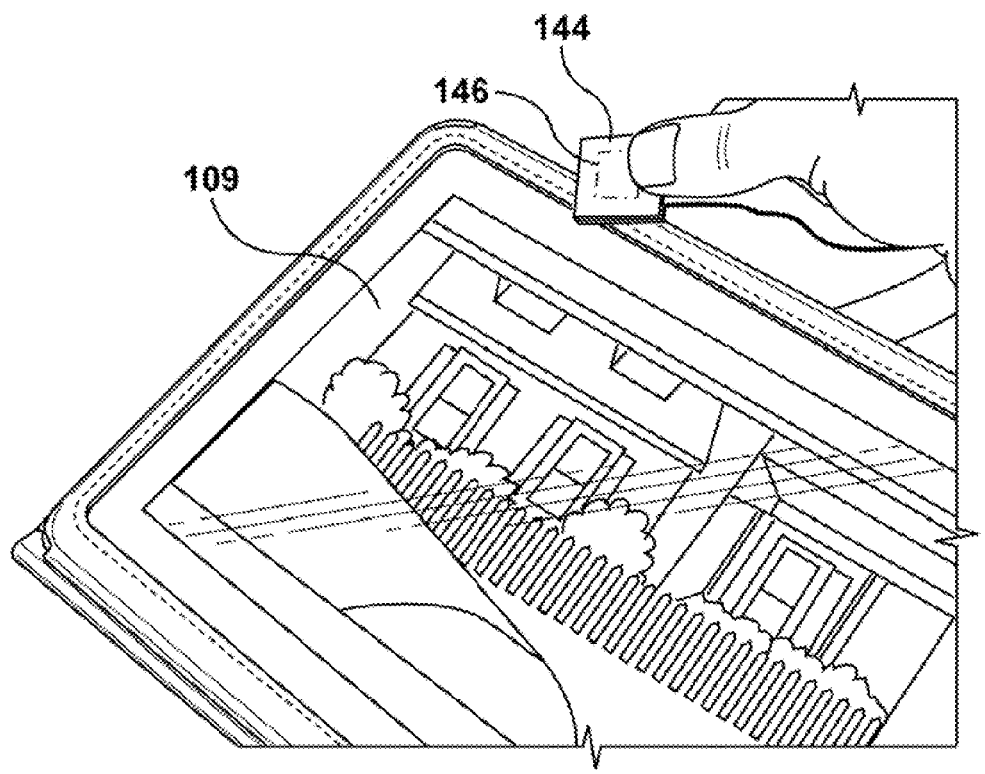
FIGS. 14-15 illustrate using the magnet in the tab of the strap to turn-off/hibernate an electronic device disposed within the holder of FIG. 1.
Figure 15:
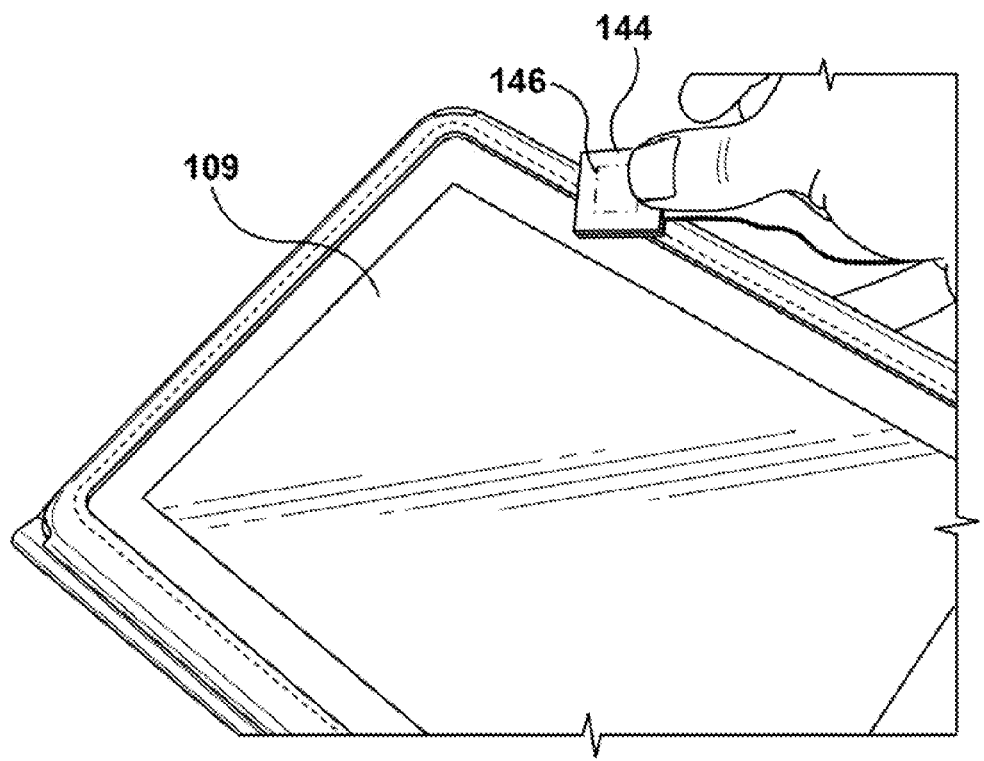

FIGS. 14-15 show another feature of the present application. In the embodiment shown, tab 144 at second end of strap 134 includes a magnet 146. Magnet 146 of tab 144 can be used to turn of electronic device 109 if electronic device 109 includes an automatic off feature as in the iPad™ from Apple Inc. FIG. 14 shows the electronic device 109 on. By placing the magnet 146 of tab 144 in the proper location, the electronic device 109 shuts off, as shown in FIG. 15.

While various embodiments according to the present invention have been described above, it should be understood that they have been presented by way of illustration and example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. An electronic device holder comprising:
a front panel including a front panel exterior surface and a front panel interior surface;
a back panel including a back panel exterior surface and a back panel interior surface;
a spine connecting the front panel to the back panel, wherein the front panel includes an inner edge coupled to the spine and an outer edge opposite the inner edge and wherein the back panel includes an inner edge coupled to the spine and an outer edge opposite the inner edge; and
a strap with a distal end fixed to the front panel, wherein the strap extends from the distal end away from the outer edge of the front panel towards and across the spine and through a friction buckle coupled to the back panel, wherein the strap can be pulled through the friction buckle such that a distance between the distal end of the strap and the friction buckle is variable.

2. The electronic device holder of claim 1, wherein the electronic device holder includes a first configuration wherein the electronic device holder is in the form of a book cover such that an electronic device is disposed within one of the front panel and the back panel and a second configuration wherein the strap is pulled through the friction buckle such that an angle between the exterior surface of the front panel and the exterior surface of the back panel is less than 180 degrees.

3. The electronic device holder of claim 2, wherein in the second configuration, the angle is variable from less than 180 degrees to zero degrees.

4. The electronic device holder of claim 1, wherein a portion the strap attached to the distal end of the strap is configured such that the portion cannot pass through the friction buckle.

5. The electronic device holder of claim 4, wherein the portion is a stiffened region.

6. An electronic device holder comprising:
a front panel including a front panel exterior surface and a front panel interior surface;
a back panel including a back panel exterior surface and a back panel interior surface;
a spine connecting the front panel to the back panel; and
a strap with a distal end of the strap attached to the exterior surface of the front panel, wherein the strap extends from the distal end across the spine and through a friction buckle attached to the back panel, wherein the strap can be pulled through the friction buckle such that a distance between the distal end of the strap and the friction buckle is variable, wherein a stiffened region attached to the distal end of the strap is configured such that the stiffened region cannot pass through the friction buckle, and, in a first configuration wherein the strap is pulled through the friction buckle such that the stiffened region is the only portion of the strap disposed between the distal end of the strap and the friction buckle, the stiffened region is sufficiently stiff to support an electronic device disposed against the interior surface of the back panel with the interior surface of the front panel disposed against a supporting surface.

7. The electronic device holder of claim 6, wherein the electronic device holder includes a second configuration wherein the electronic device holder is in the form of a book cover such that an electronic device is disposed within one of the front panel and the back panel and the front panel interior surface faces the back panel interior surface.

8. The electronic device holder of claim 7, wherein in the second configuration, the strap further extends through the friction buckle across an outer edge of back panel, across an outer edge of the front panel, and wherein a first connector is coupled to a second end of the strap and is secured to a second connector coupled to the back panel.

9. The electronic device holder of claim 8, wherein the first connector and the second connector are magnets.

10. The electronic device holder of claim 7, wherein the electronic device holder further comprises a third configuration wherein the strap is pulled through the friction buckle such that an angle between the exterior surface of the front panel and the exterior surface of the back panel is less than 180 degrees and the electronic device holder is supported against the supporting surface on outer edges of the front panel and the back panel.

11. The electronic device holder of claim 7, wherein in the third configuration, the angle is variable from less than 180 degrees to zero degrees.

12. The electronic device holder of claim 2, wherein in the first configuration, the strap further extends through the friction buckle across the outer edge of back panel, across the outer edge of the front panel, and wherein a first connector is coupled to a second end of the strap and is secured to a second connector coupled to the back panel.

13. The electronic device holder of claim 12, wherein the first connector and the second connector are magnets.

* * * * *